(12) United States Patent
Huang et al.

(10) Patent No.: US 9,025,324 B2
(45) Date of Patent: May 5, 2015

(54) ELECTRONIC DEVICE

(71) Applicants: Pei-Pin Huang, Taipei (TW); Li-Fang Chen, Taipei (TW); Yung-Hsiang Chen, Taipei (TW)

(72) Inventors: Pei-Pin Huang, Taipei (TW); Li-Fang Chen, Taipei (TW); Yung-Hsiang Chen, Taipei (TW)

(73) Assignee: Compal Electronics, Inc., Taipei (TW)

( * ) Notice: Subject to any disclaimer, the term of this patent is extended or adjusted under 35 U.S.C. 154(b) by 212 days.

(21) Appl. No.: 13/888,393

(22) Filed: May 7, 2013

(65) Prior Publication Data

US 2013/0314859 A1 Nov. 28, 2013

Related U.S. Application Data

(60) Provisional application No. 61/650,456, filed on May 22, 2012.

(51) Int. Cl.
*G06F 1/16* (2006.01)
*H05K 7/02* (2006.01)

(52) U.S. Cl.
CPC ............... *G06F 1/1662* (2013.01); *H05K 7/02* (2013.01); *G06F 1/1616* (2013.01); *G06F 1/1624* (2013.01); *G06F 1/1637* (2013.01); *G06F 1/1681* (2013.01)

(58) Field of Classification Search
USPC ......... 312/334.1, 227, 265; 349/149, 150, 58; 16/337, 354, 334, 239, 262, 330; 361/679.27, 679.01, 679.09, 671.21, 361/679.29, 679.55, 679.05, 679.57, 361/679.56, 679.2, 679.58, 679.26, 679.41, 361/679.06; 455/566, 575.1, 575.4, 575.3, 455/550.1, 41.1, 575.6, 556.1, 414.2, 418, 455/575.7

See application file for complete search history.

(56) References Cited

U.S. PATENT DOCUMENTS

| 8,259,440 | B2 * | 9/2012 | Lin ........................... 361/679.29 |
| 2008/0238787 | A1 * | 10/2008 | Lin et al. ........................ 343/702 |
| 2013/0163201 | A1 * | 6/2013 | Wang et al. .................... 361/692 |

FOREIGN PATENT DOCUMENTS

| TW | M249084 | 11/2004 |
| TW | M281256 | 11/2005 |

\* cited by examiner

*Primary Examiner* — Hung Duong
(74) *Attorney, Agent, or Firm* — Jianq Chyun IP Office

(57) ABSTRACT

An electronic device includes first and second bodies. The second body includes a display module and a supporting assembly. The supporting assembly includes a sliding component slidably disposed on the display module and a pivot component pivoted to the first body and the sliding component. When the second body expands from the first body through the rotation of the pivot component relative to the first body, the sliding component and the pivot component are adapted to rotate relative to each other so that a bottom side of the display module moves to a predetermined position on the first body. When the bottom side is located at the predetermined position, the sliding component and the display module are adapted to slide relative to each other so that the display module rotate around the bottom side, so as to change an included angle between the display module and the first body.

7 Claims, 5 Drawing Sheets

ELECTRONIC DEVICE

CROSS-REFERENCE TO RELATED APPLICATION

This application claims the priority benefits of U.S. provisional application Ser. No. 61/650,456, filed on May 22, 2012. The entirety of the above-mentioned patent applications is hereby incorporated by reference herein and made a part of this specification.

BACKGROUND

1. Technical Field

The invention relates to an electronic device. Particularly, the invention relates to an electronic device having a display module.

2. Related Art

Since a notebook computer has same functions with that of a desktop computer, and has a thin and slim design to facilitate a user to carry around, the notebook computers have become indispensable tools for some users. Along with continuous decline of prices of the notebook computers, some users even use the notebook computers to directly replace the desktop computers.

Generally, the notebook computer has a display module (for example, a liquid crystal display (LCD)), and the display module may have a touch input function. To facilitate the user comfortably performing touch operations on the display module, in some notebook computers, a bottom side of the display module is not directly pivoted to a host but is connected to the host through a supporting assembly, such that the bottom side of the display module can move along the host to reposition the display module closer to the user. However, in a current design, after the bottom side of the display module moves along the host to be repositioned, an inclination angle of the display module is fixed and cannot be adjusted, which causes inconvenience in utilization.

SUMMARY

The invention is directed to an electronic device, in which an inclination angle of a display module is adjusted through relative sliding between a supporting assembly and the display module.

The invention provides an electronic device including a first body and a second body. The second body includes a display module and a supporting assembly. The supporting assembly includes a sliding component and a pivot component. The sliding component is slidably disposed on the display module. Two ends of the pivot component are respectively pivoted to a rear side of the first body and the sliding component. The pivot component is adapted to rotate relative to the first body to expand the second body from the first body. When the second body expands from the first body, the sliding component and the pivot component are adapted to rotate relative to each other so that a bottom side of the display module moves to a predetermined position on the first body from the rear side of the first body. When the bottom side of the display module is located at the predetermined position, the sliding component and the display module are adapted to slide relative to each other so that the display module rotates relative to the first body while taking the bottom side as a rotation axis, so as to change an included angle between the display module and the first body.

In an embodiment of the invention, when the bottom side of the display module moves along the first body, the sliding component and the pivot component rotate relative to each other, and the pivot component rotates relative to the first body.

In an embodiment of the invention, when the display module rotates relative to the first body while taking the bottom side as the rotation axis, the sliding component and the pivot component rotate relative to each other, and the pivot component rotates relative to the first body.

In an embodiment of the invention, when the bottom side of the display module is located at the rear side of the first body, the pivot component is closed to the display module, and when the bottom side of the display module is located at the predetermined position on the first body, the pivot component expands from the display module.

In an embodiment of the invention, the electronic device further includes an input module, and the input module is slidably disposed on the first body and is pivoted to the bottom side of the display module, when the bottom side of the display module moves to the predetermined position from the rear side of the first body, the input module moves towards a front side of the first body.

In an embodiment of the invention, the display module has a containing slot, and the sliding component is adapted to slide relative to the display module to enter the containing slot, so that at least a part of the sliding component is hidden in the display module.

In an embodiment of the invention, the containing slot has an end, and when the sliding component slides relative to the display module to contact the end, the end stops the sliding component and the display module from continuing to slide relative to each other, so as to limit an inclination degree of the display module relative to the first body.

According to the above descriptions, the sliding component of the supporting assembly is slidably disposed on the display module, and the pivot component of the supporting assembly is pivoted to the first body and the sliding component. In this way, after the bottom side of the display module moves to the predetermined position along the first body to place the display module close to the user, the display module can rotate relative to the first body while taking the bottom side as the rotation axis through the relative sliding of the sliding component and the display module, so as to facilitate adjusting the inclination angle of the display module by the user and improve utilization convenience of the electronic device.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
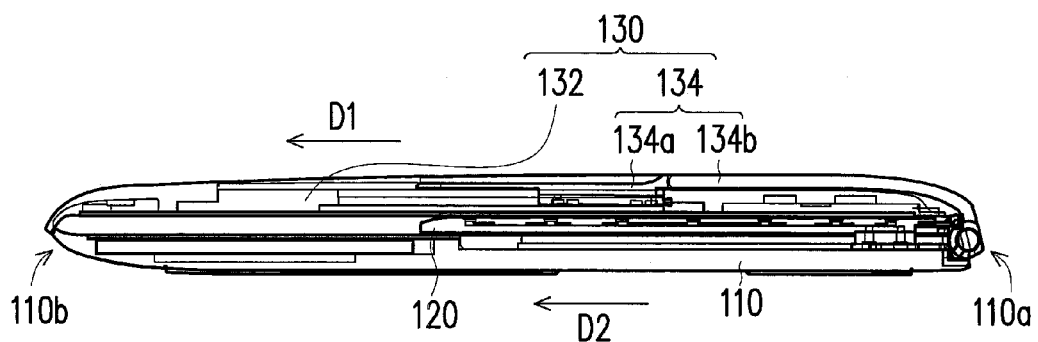
FIG. 1 is a cross-sectional view of an electronic device according to an embodiment of the invention.
Figure 2:
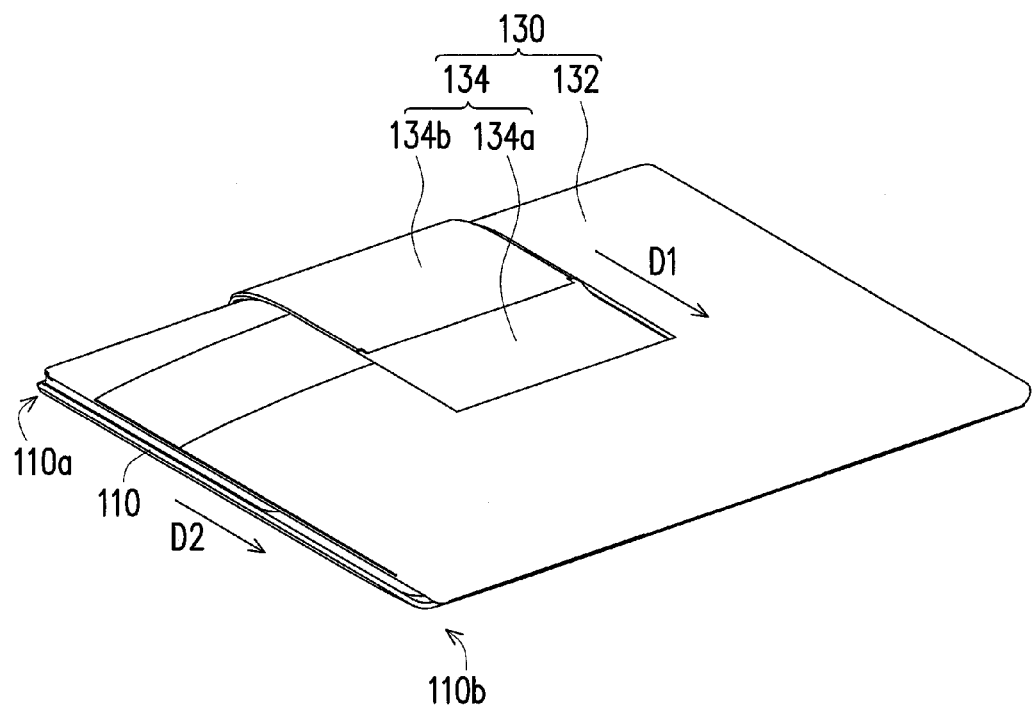
FIG. 2 is a three-dimensional view of an electronic device of FIG. 1.
Figure 3:
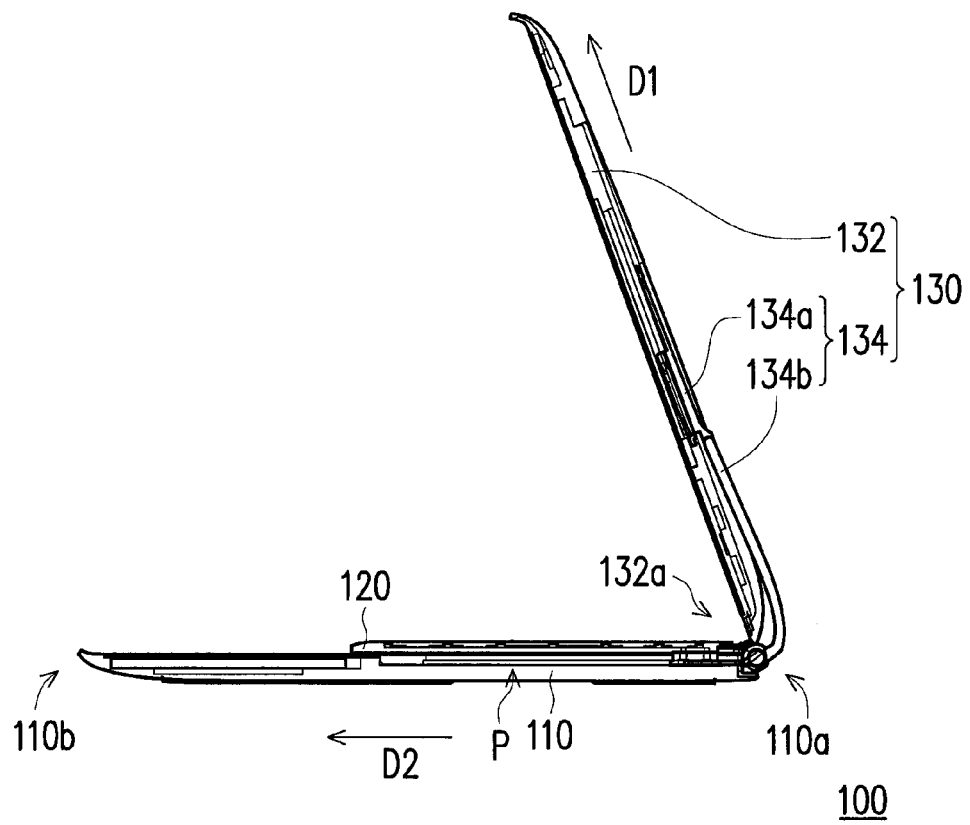
FIG. 3 is a schematic diagram of the electronic device of FIG. 1 with a second body expanding from the first body.

FIG. 1 is a cross-sectional view of an electronic device according to an embodiment of the invention. FIG. 2 is a three-dimensional view of an electronic device of FIG. 1. FIG. 3 is a schematic diagram of the electronic device of FIG. 1 with a second body expanding from the first body. Referring to FIG. 1 to FIG. 3, the electronic device 100 of the present embodiment is, for example, a notebook computer and includes a first body 110 and a second body 130. The first body 110 is, for example, a host of the notebook computer, and the second body 130 includes a display module 132 and a supporting assembly 134. The supporting assembly 134 includes a sliding component 134a and a pivot component 134b. The sliding component 134a is slidably disposed on the display module 132 along a direction D1. Two ends of the pivot component 134b are respectively pivoted to a rear side 110a of the first body 110 and the sliding component 134a. The pivot component 134b is adapted to rotate relative to the first body 110 to expand the second body 130 from a state shown in FIG. 1 to a state shown in FIG. 3 relative to the first body 110.

Figure 4A:
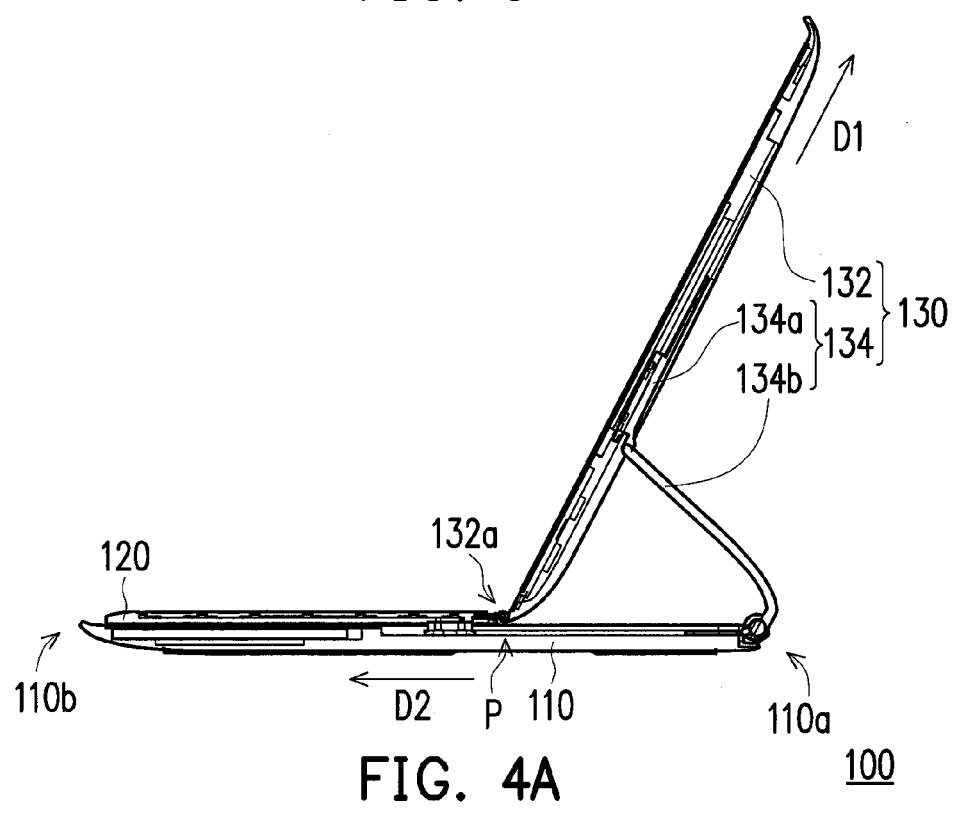
FIG. 4A and FIG. 4B are operation schematic diagrams of the electronic device of FIG. 3.
Figure 4B:
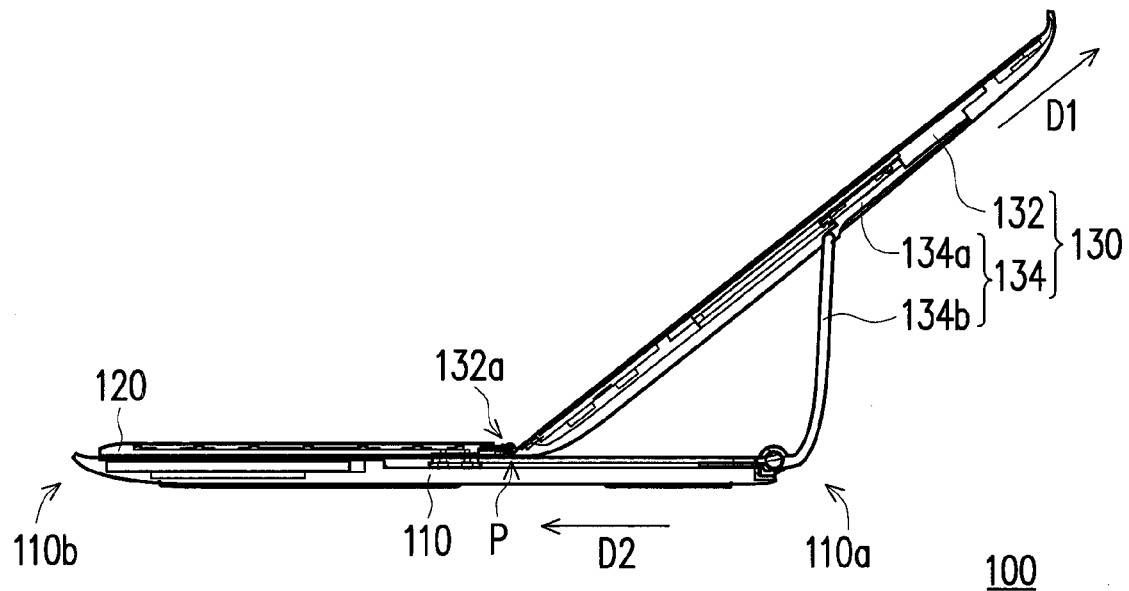

FIG. 4A and FIG. 4B are operation schematic diagrams of the electronic device of FIG. 3. When the second body 130 expands from the first body 110 as that shown in FIG. 3, the sliding component 134a and the pivot component 134b are adapted to rotate relative to each other so that a bottom side 132a of the display module 132 moves to a predetermined position P on the first body 110 from the rear side 110a of the first body 110, as that shown in FIG. 4A. The display module 132 of the present embodiment, for example, has a touch input function, and according to the above operations, the display module 132 is close to the user to facilitate the user performing touch operations on the display module 132. When the bottom side 132a of the display module 132 moves along the first body 110 as that shown in FIG. 3 and FIG. 4A, the sliding component 134a and the pivot component 134b rotate relative to each other and the pivot component 134b rotates relative to the first body 110, so that the display module 132 and the supporting assembly 134 can actuate smoothly. The predetermined position P can be adjusted according to a design requirement, which is not limited by the invention.

When the bottom side 132a of the display module 132 is located at the predetermined position P as that shown in FIG. 4A, the sliding component 134a and the display module 132 are adapted to slide relative to each other so that the display module 132 rotates relative to the first body 110 while taking the bottom side 132a as a rotation axis, so as to change an included angle between the display module 132 and the first body 110, as that shown in FIG. 4B. In this way, after the display module 132 is changed from the state shown in FIG. 3 to the state shown in FIG. 4A to move closer to the user, the user can further adjust an inclination angle of the display module 132 as that shown in FIG. 4A and FIG. 4B, so as to improve utilization convenience of the electronic device 100. When the display module 132 takes the bottom side 132a as the rotation axis to rotate relative to the first body 110 as that shown in FIG. 4A to FIG. 4B, the sliding component 134a and the pivot component 134b are, for example, rotate relative to each other, and the pivot component 134b rotates relative to the first body 110, such that the display module 132 and the supporting assembly 134 can actuate smoothly.

In the above operations, the bottom side 132a of the display module 132 first moves to the predetermined position P along the first body 110 as that shown in FIG. 3 and FIG. 4A, and then the sliding component 134a slides relative to the display module 132 as that shown in FIG. 4A and FIG. 4B, though the invention is not limited thereto, and in other embodiments, while the bottom side 132a of the display module 132 moves along the first body 110, the sliding component 134a can simultaneously slide relative to the display module 132, and the electronic device 100 can also be changed from the state shown in FIG. 3 to the state shown in FIG. 4B. Moreover, the inclination angle of the display module 132 can be adjusted between an inclination angle shown in FIG. 4A and an inclination angle shown in FIG. 4B according to the user's requirement, which is not limited by the invention.

In the present embodiment, when the bottom side 132a of the display module 132 is located at the rear side 110a of the first body 110 as that shown in FIG. 3, the pivot component 134b is closed to the display module 132. When the bottom side 132a of the display module 132 is located at the predetermined position P on the first body 110 as that shown in FIG. 4A or FIG. 4B, the pivot component 134b expands from the display module 132 so that the supporting assembly 134 can support the display module 132, so as to avoid swaying of the display module 132 due to the user's touch operation.

In the present embodiment, the electronic device 100 further includes an input module 120 (for example, a keyboard), and the input module 120 is slidably disposed on the first body 110 along a direction D2 and is pivoted to the bottom side 132a of the display module 132. When the bottom side 132a of the display module 132 moves to the predetermined position P from the rear side 110a of the first body 110, the input module 120 correspondingly moves towards a front side 110b of the first body 110, such that the input module 120 can move to a position suitable for user's operation along with movement of the display module 132.

Figure 5:
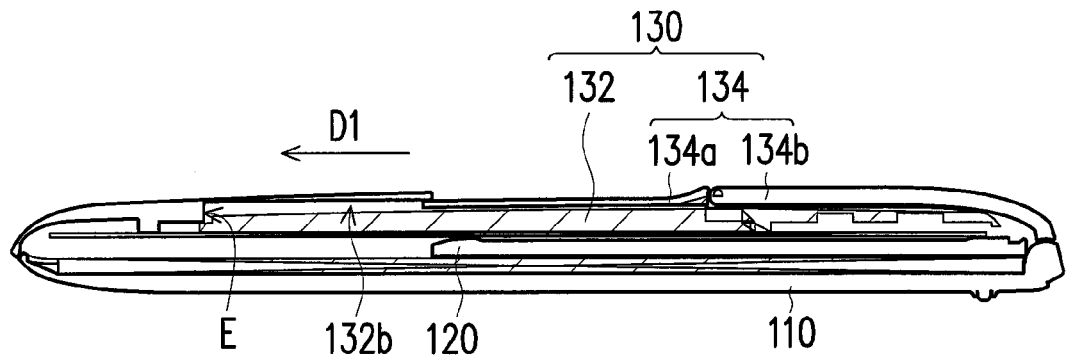
FIG. 5 is a cross-sectional view of a part of components of the electronic device of FIG. 1.

FIG. 5 is a cross-sectional view of a part of components of the electronic device of FIG. 1. Referring to FIG. 5, the display module 132 of the present embodiment has a containing slot 132b, where the containing slot 132b is used for containing the sliding component 134a. In detail, in a process that the electronic device 100 is changed from the state shown in FIG. 4A to the state shown in FIG. 4B, the sliding component 134a slides relative to the display module 132 along the direction D1 to enter the containing slot 132b, so that at least a part of the sliding component 134a is hidden in the display module 132, so as to achieve a better appearance of the electronic device 100. Further, the containing slot 132b has an end E, and when the sliding component 134a slides relative to the display module 132 along the direction D1 to contact the end E of the containing slot 132b, the end E of the containing slot 132b stops the sliding component 134a and the display module 132 from continuing to slide relative to each other, so as to limit an inclination degree of the display module 132 relative to the first body 110, and achieve an effect of positioning the display module 132. In other embodiments, the sliding component can also be exposed to the display module, which is described below with reference of figures.

Figure 6:
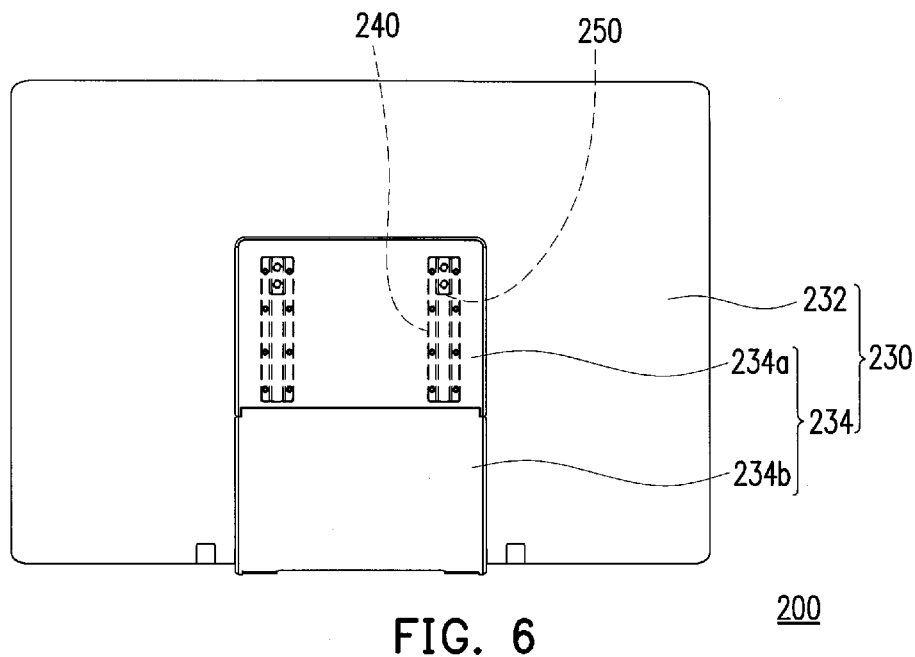
FIG. 6 is a top view of an electronic device according to another embodiment of the invention.
Figure 7:
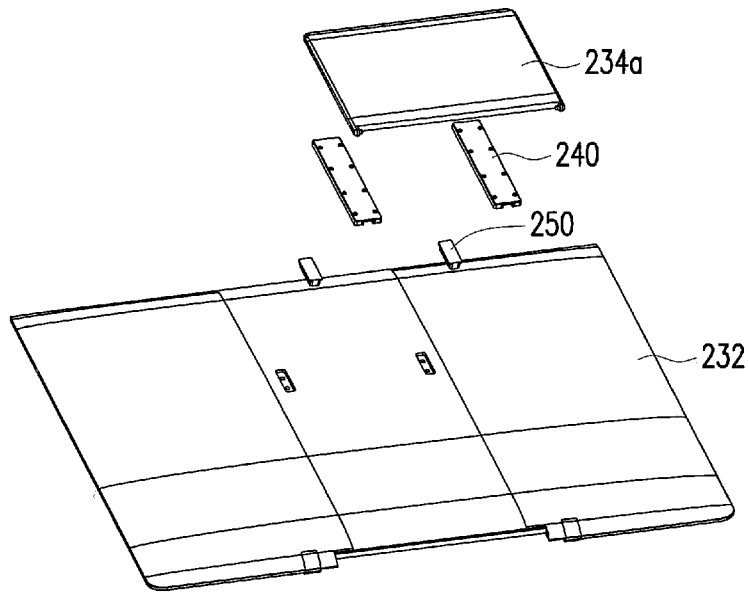
FIG. 7 is an exploded view of a sliding component and a display module of FIG. 6.
Figure 8:
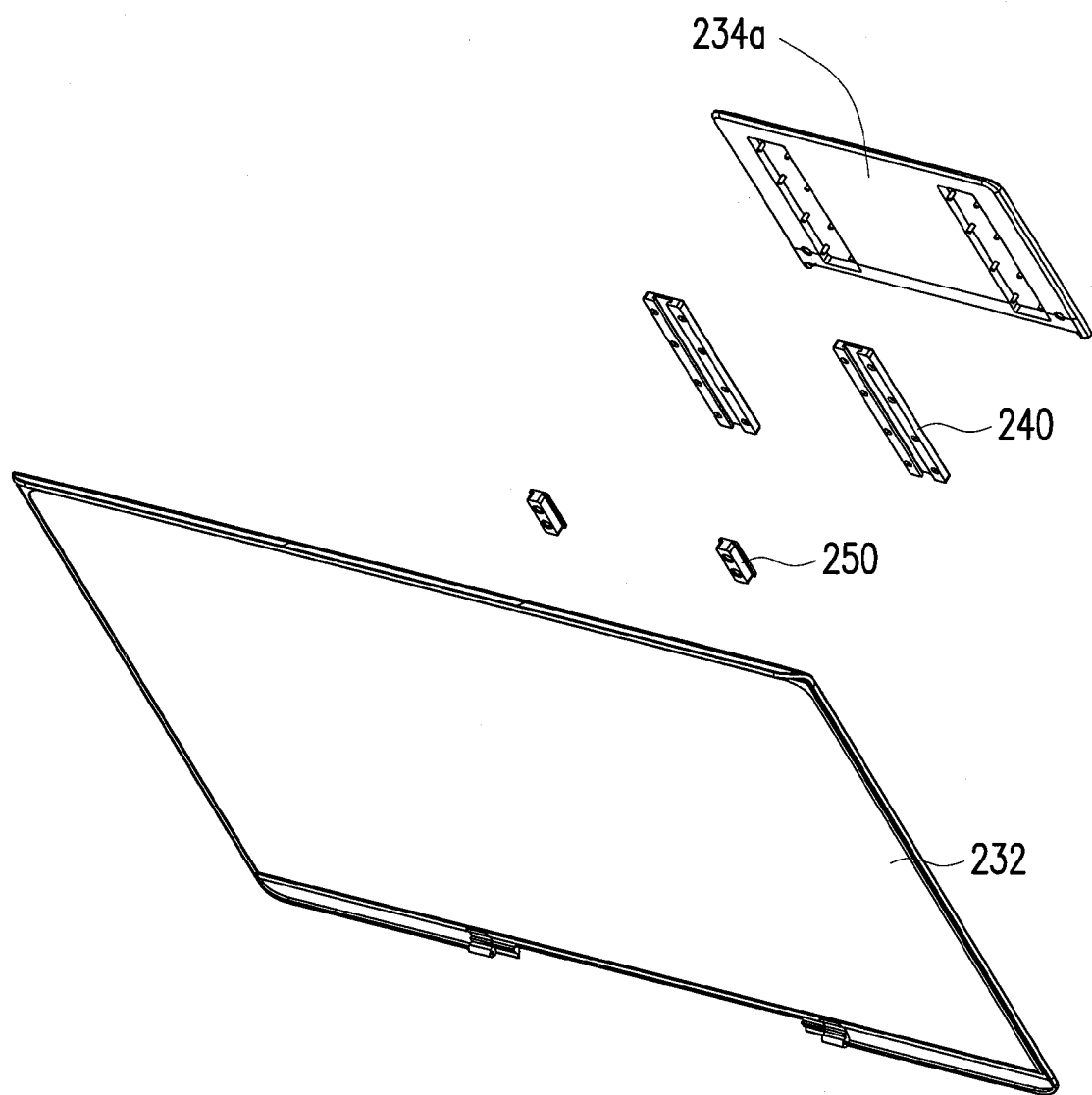
FIG. 8 is an exploded view of the sliding component and the display module of FIG. 7 viewing from another viewing angle.

FIG. 6 is a top view of an electronic device according to another embodiment of the invention. FIG. 7 is an exploded view of a sliding component and a display module of FIG. 6. FIG. 8 is an exploded view of the sliding component and the display module of FIG. 7 viewing from another viewing angle. For clarity's sake, only a part of the display module 232 is illustrated in FIG. 7 and FIG. 8. Referring to FIG. 6 to FIG. 8, configurations and actuation methods of a first body (which is not illustrated in FIG. 6 for the sake of viewing angle), a second body 230, a display module 232, a supporting assembly 234, a sliding component 234a and a pivot component 234b of the electronic device 200 of the present embodiment are similar to that of the first body 110, the second body 130, the display module 132, the supporting assembly 134, the sliding component 134a and the pivot component 134b of the electronic device 100 of the aforementioned embodiment, so that detailed descriptions thereof are not repeated. A difference between the electronic device 200 and the electronic device 100 is that the display module 232 of the electronic device 200 does not have the containing slot, and when the sliding component 234a of the supporting assembly 234 slides relative to the display module 232, the sliding component 234a is kept exposed to the display module 232.

In the present embodiment, the sliding component 234a is slidably disposed on the display module 232 through sliding rails 240 and sliding blocks 250. In detail, the sliding rails 240 (two sliding rails are illustrated) are fixed to the sliding component 234a, and the sliding blocks 250 (two sliding blocks are illustrated) are fixed to the display module 232, and the sliding rails 240 and the sliding blocks 240 are slidably disposed relative to each other, so that the sliding component 234a can slide along the display module 232 through relative sliding between the sliding rails 240 and the sliding blocks 250. In other embodiments, the sliding component can be slidably disposed on the display module through other suitable structures, which is not limited by the invention.

In summary, the sliding component of the supporting assembly is slidably disposed on the display module, and the pivot component of the supporting assembly is pivoted to the first body and the sliding component. In this way, after the bottom side of the display module moves to the predetermined position along the first body to place the display module closer to the user, the display module can rotate relative to the first body while taking the bottom side as the rotation axis through the relative sliding of the sliding component and the display module, so as to facilitate the adjustment of the inclination angle of the display module according to the user's needs and improve utilization convenience of the electronic device. Moreover, the display module may have a containing slot, such that when the sliding component slides relative to the display module, the sliding component enters the containing slot, and at least a part of the sliding component is hidden in the display module, so as to achieve better appearance of the electronic device.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electronic device, comprising:
   a first body; and
   a second body, comprising:
   a display module; and
   a supporting assembly, comprising a sliding component and a pivot component, wherein the sliding component is slidably disposed on the display module, two ends of the pivot component are respectively pivoted to a rear side of the first body and the sliding component, and the pivot component is adapted to rotate relative to the first body to expand the second body from the first body,
   when the second body expands from the first body, the sliding component and the pivot component are adapted to rotate relative to each other so that a bottom side of the display module moves to a predetermined position on the first body from the rear side of the first body,
   when the bottom side of the display module is located at the predetermined position, the sliding component and the display module are adapted to slide relative to each other so that the display module rotates relative to the first body while taking the bottom side as a rotation axis, so as to change an included angle between the display module and the first body.

2. The electronic device as claimed in claim 1, wherein when the bottom side of the display module moves along the first body, the sliding component and the pivot component rotate relative to each other, and the pivot component rotates relative to the first body.

3. The electronic device as claimed in claim 1, wherein when the display module rotates relative to the first body while taking the bottom side as the rotation axis, the sliding component and the pivot component rotate relative to each other, and the pivot component rotates relative to the first body.

4. The electronic device as claimed in claim 1, wherein when the bottom side of the display module is located at the rear side of the first body, the pivot component is closed to the display module, and when the bottom side of the display module is located at the predetermined position on the first body, the pivot component expands from the display module.

5. The electronic device as claimed in claim 1, further comprising an input module, wherein the input module is slidably disposed on the first body and is pivoted to the bottom side of the display module, and when the bottom side of the display module moves to the predetermined position from the rear side of the first body, the input module moves towards a front side of the first body.

6. The electronic device as claimed in claim 1, wherein the display module has a containing slot, and the sliding component is adapted to slide relative to the display module to enter the containing slot, so that at least a part of the sliding component is hidden in the display module.

7. The electronic device as claimed in claim 6, wherein the containing slot has an end, and when the sliding component slides relative to the display module to contact the end, the end stops the sliding component and the display module from continuing to slide relative to each other, so as to limit an inclination degree of the display module relative to the first body.

* * * * *